United States Patent
Blott et al.

(10) Patent No.: US 9,711,194 B2
(45) Date of Patent: Jul. 18, 2017

(54) CIRCUITS FOR AND METHODS OF CONTROLLING THE OPERATION OF A HYBRID MEMORY SYSTEM

(71) Applicant: Xilinx, Inc., San Jose, CA (US)

(72) Inventors: Michaela Blott, Dublin (IE); Ling Liu, Dublin (IE); Kornelis A. Vissers, Sunnyvale, CA (US)

(73) Assignee: XILINX, INC., San Jose, CA (US)

( * ) Notice: Subject to any disclaimer, the term of this patent is extended or adjusted under 35 U.S.C. 154(b) by 66 days.

(21) Appl. No.: 14/607,978

(22) Filed: Jan. 28, 2015

(65) Prior Publication Data

US 2016/0217835 A1    Jul. 28, 2016

(51) Int. Cl.
G06F 12/02    (2006.01)
G06F 12/08    (2016.01)
G11C 7/10    (2006.01)
G06F 12/0813    (2016.01)
G06F 13/16    (2006.01)

(52) U.S. Cl.
CPC ........ *G11C 7/1057* (2013.01); *G06F 12/0246* (2013.01); *G06F 12/0813* (2013.01); *G06F 13/1694* (2013.01); *G11C 7/1072* (2013.01); *G06F 2212/7203* (2013.01)

(58) Field of Classification Search
CPC ............. G06F 12/0246; G06F 12/0813; G06F 13/1694; G06F 2212/7203
See application file for complete search history.

(56) References Cited

U.S. PATENT DOCUMENTS

| 6,446,141 B1 | 9/2002 | Nolan et al. |
| 2001/0019509 A1* | 9/2001 | Aho ............ G06F 12/0638 365/205 |
| 2008/0126716 A1 | 5/2008 | Daniels |
| 2010/0325199 A1 | 12/2010 | Park et al. |
| 2012/0102298 A1 | 4/2012 | Sengupta et al. |

(Continued)

FOREIGN PATENT DOCUMENTS

WO        2008131058      10/2008
WO  PCT/US2014/068228   12/2014

OTHER PUBLICATIONS

U.S. Appl. No. 14/100,250, Blott et al., filed Dec. 9, 2013, San Jose, CA USA.

(Continued)

*Primary Examiner* — Yong Choe
(74) *Attorney, Agent, or Firm* — John J. King

(57) ABSTRACT

A circuit for controlling the operation of a memory system having different types of memory is described. The circuit comprises a first memory having a first type of memory element and having a first access time; a second memory having a second type of memory element and having a second access time, wherein the second type of memory element is different than the first type of memory element; a memory control circuit enabling access to the first memory and the second memory; a delay buffer coupled to the second memory to compensate for a difference in the first access time and the second access time; and a circuit for merging outputs of the first memory and delayed outputs of the second memory to generate ordered output data. A method of controlling the operation of a memory system is also disclosed.

19 Claims, 12 Drawing Sheets

(56) References Cited

U.S. PATENT DOCUMENTS

2014/0310574 A1  10/2014 Yu
2016/0021547 A1* 1/2016 Wang .................... H04W 16/26
                                                         370/328

OTHER PUBLICATIONS

U.S. Appl. No. 13/683,720, filed Nov. 21, 2012, Blott, M. et al., San Jose, CA USA.
Berezecki, M. et al., "Many-Core Key-Value Store", Green Computing Conference and Workshops (IGCC), 2011 International, pp. 1-8, Jul. 25-28, 2011.
Berezecki, M. et al., "Power and Performance Evaluation of Memchaced on the TILEPro64 Architecture", Sustainable Computing: Informatics and Systems, vol. 2 issue, Jun. 2012, pp. 81-90.
Hetherington, Tayler H., et al., "Characterizing and Evaluating a Key-value Store Application on Heterogeneous CPU-GPU Systems", IEEE Internatinal Symposium on Performance Analysis of Systems and Software (ISPASS), Apr. 1-3, 2012, pp. 11, New Brunswick, NJ.
Lim, K. et al., "Thin Servers with Smart Pipes: Designing SoC Accelerators for Memcached", $40^{th}$ International Symposium on Computer Architecture, ISCA 2013, Jun. 23-27, 2013, 12 pages, Tel-Aviv, Israel.
Ouyang, X., et al., "SSD-Assisted Hybrid Memory to Accelerate Memcached Over High Performance Networks", IEEE $41^{st}$ International Conference on Parallel Processing, ICPP 2012, Sep. 10-13, 2012, pp. 470-479, 10-13, Pittsburgh, PA, USA.

* cited by examiner

CIRCUITS FOR AND METHODS OF CONTROLLING THE OPERATION OF A HYBRID MEMORY SYSTEM

FIELD OF THE INVENTION

The present invention relates generally to integrated circuit devices, and in particular, to circuits for and methods of controlling the operation of a memory system having different types of memory.

BACKGROUND OF THE INVENTION

Data centers deliver storage, social networking, gaming, web search and many other services coherently across diverse computing devices anywhere in the world, and are growing each day both in size and in the sheer diversity of provided services. Several key factors contribute to this growth, including an explosion in the volume of amorphous data now captured and exchanged. One of the fundamental challenges faced in implementing data centers is processing and storing this ever-increasing amount of data.

Data centers that are used to store large amounts of data for various purposes are becoming important in many industries, where data centers are focused on improved operation when storing and processing an ever increasing amount of data. Solid state drives (SSDs) are rapidly gaining in popularity as they provide an additional tier in a storage hierarchy with both much higher performance (e.g. input/output operations per second (IOPS)) and lower access latency than hard disk drives, and greater storage density, lower cost and lower power consumption than standard dynamic random access memory (DRAM). However, their large access latency prevents SSDs from being combined with standard DRAM, as multicore processors cannot handle large access latencies without sacrificing performance.

Accordingly, improved circuits for controlling the operation of a memory system would be beneficial.

SUMMARY OF THE INVENTION

A circuit for controlling the operation of a memory system having different types of memory is described. The circuit comprises a first memory having a first type of memory element and having a first access time; a second memory having a second type of memory element and having a second access time, wherein the second type of memory element is different than the first type of memory element; a memory control circuit enabling access to the first memory and the second memory; a delay buffer coupled to the second memory to compensate for a difference in the first access time and the second access time; and a circuit for merging output data of the first memory and delayed output data of the second memory to generate ordered output data.

A method of controlling the operation of a memory system having different types of memory is also described. The method comprises implementing a first memory having a first type of memory element and having a first access time; implementing a second memory having a second type of memory element and having a second access time, wherein the second type of memory element is different than the first type of memory element; enabling access to the first memory and the second memory; coupling a delay buffer to the second memory to compensate for a difference in the first access time and the second access time; and merging output data of the first memory and delayed output data of the second memory to generate ordered output data.

DETAILED DESCRIPTION OF THE DRAWINGS

As large memory networks, such as those used in data centers, continue to become more significant and are relied upon to store greater amounts of data, the performance of memory networks is becoming more important. A data-flow architecture according to the various circuits and methods set forth below enables the operation of a memory network having different types of memory. For example, a circuit for controlling the operation of a memory system compensates for differences in the memories, such as large access latencies. The circuits and methods set forth below find particular application in programmable logic devices (PLDs), such as field programmable gate arrays (FPGAs), and enable creating storage systems based on PLDs that can process and store terabytes of data, at much lower cost, lower power, and with increased compute and storage densities than systems implementing conventional processors.

For example, a circuit enables controlling the operation of a memory system with different types of memory having different properties, such as different access times, and comprises a memory control circuit enabling access to the different memory. As will be described in more detail below, various types of memory, including volatile or non-volatile memory, could be implemented. A delay buffer may be coupled to one of the memories to compensate for the differences in access times, for example. A circuit may be implemented for merging outputs of one memory and delayed outputs of another to generate ordered output data. Unlike with conventional multicore processor devices, FPGAs implementing dataflow architectures can successfully compensate for these large access latencies and enable SSD memory to be used in combination with DRAM as a preferred memory hierarchy, effectively replacing DRAM. Thereby, it is possible to create storage appliances, based on FPGAs, that can process and store terabytes of data, at much lower cost, lower power, increased compute and storage densities, and reduced latency.

While the specification includes claims defining the features of one or more implementations that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

Figure 1:
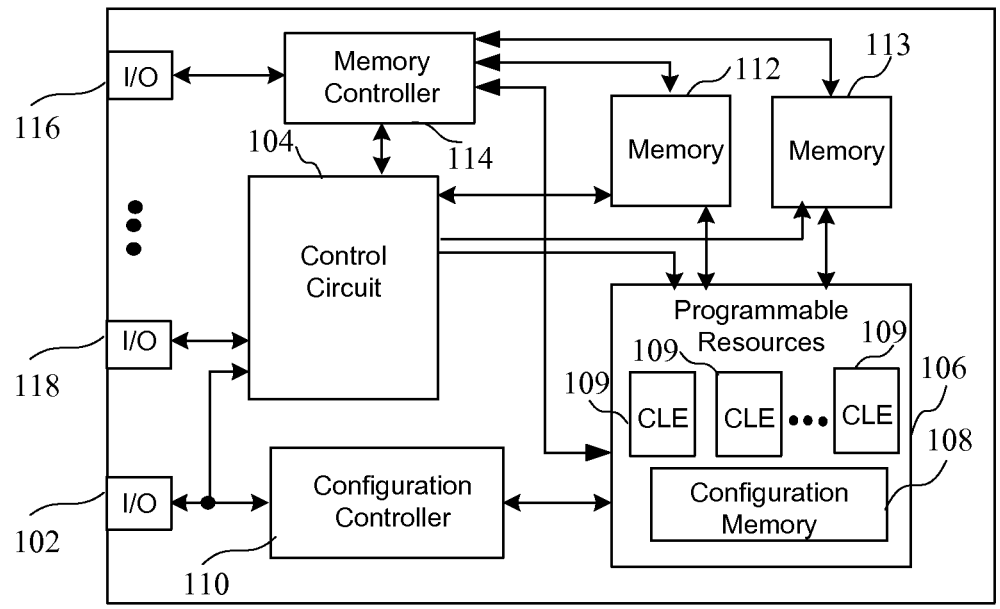
FIG. 1 is block diagram of a circuit enabling access to a plurality of memories.

Turning first to FIG. 1, a block diagram of integrated circuit device having a plurality of memories is shown. In particular, an input/output port 102 is coupled to a control circuit 104 that controls programmable resources 106 having configuration memory 108. Configuration data, described in more detail below in reference to FIGS. 16-18, may be provided to the configuration memory 108 by a configuration controller 110. The configuration data enables the operation of configurable elements 109. A plurality of memory elements, shown here as memory 112 and memory 113, may be coupled to the control circuit 104 and the programmable resources 106. A memory controller 114 may be coupled to the control circuit 104, programmable resources 106 and the memories 112 and 113, and may receive signals external to the integrated circuit device or transmit signals by way of an I/O port 116. The memory controller 114 may control the memories 112 and 113, as will be described in more detail below. Alternatively, the control circuit 104 or a circuit of the programmable resources may control the memories 112 and 113 as described below. Other I/O ports may be coupled to circuits of the integrated circuit device, such as I/O port 118 that is coupled to the control circuit 104 as shown. The circuits and methods set forth in more detail below may be implemented within a single integrated circuit die, or may be implemented in a multi-chip module or some other system controlling different types of memories in a memory network.

Figure 2:
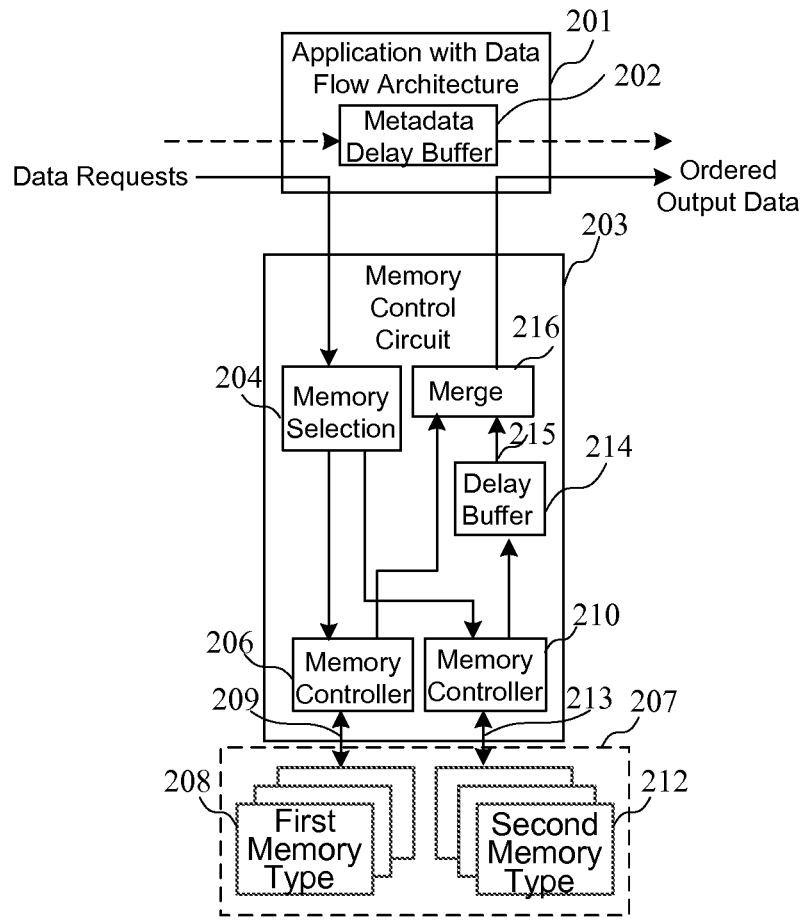
FIG. 2 is a block diagram of a circuit for controlling the operation of a memory system having different types of memory and enabling in-order processing.

Turning now to FIG. 2, a block diagram of a circuit for controlling the operation of a memory system having different types of memory and enabling in-order processing is shown. An application 201 with a data flow architecture having data flow buffers enables communication with a memory control circuit 203. Application metadata is shown by the dashed line, and the memory requests and responses are shown by the solid lines in FIGS. 2 and 3. When data is routed "in-order" in the circuit of FIG. 2, data generated in response to data requests to the memories of FIG. 2 will be provided in the same order as the data requests. In contrast, when data is routed "out-of-order," the data will be provided in the order that it is output by the different memories, regardless of any latency of one memory with respect to a second memory. That is, data generated in a first data request may not be provided until after data is provided in a later data request. When data routed by the circuit of FIG. 2 is routed "in-order," a metadata delay buffer 202 is provided to ensure that the metadata associated with a given data request is matched up with the output data for the data request. That is, because the metadata provides information related to the data associated with the data request, it is necessary that the metadata is matched up with the data associated with the data request. Accordingly, the metadata delay buffer will ensure that any data generated by a memory of FIG. 2 is matched up with the metadata associated with that data.

As described in more detail below, the application 201 could be any application implemented by an integrated circuit, or an integrated circuit implemented in a larger system, such as a computer having an integrated circuit. By way of example, the application 201 could be a data processing circuit having processing elements implemented in the programmable resources 106 of FIG. 1, while the memory controller 203 could be implemented in the memory controller 114. A memory selection circuit 204 enables the selection of a memory of a plurality of available memories 207 for reading or writing data. The memory selection circuit 204 may interface with a plurality of memory sub-systems having a plurality of memory of the same type, and may include a first memory controller 206 to access a first type of memory 208 (which generates output data 209 of the first type of memory 208) and a second memory controller 210 to access a second type of memory 212 (which generates output data 213 of the second type of memory 212), where the first type of memory is different than the second type of memory. A delay buffer 214 coupled to the output of the second type of memory 212 enables a merge circuit 216 to generate ordered output data based upon the output data 209 of the first type of memory 208 and delayed output data 215 of the second type of memory 212. That is, the ordered output data contains data in a desired ordered corresponding to the order of the data requests, where the delay buffer 214 delays a portion of data to be included in the ordered output data so that the merge circuit 216 can place the data in the correct order to be generated as ordered output data.

All of the elements of FIG. 2 could be implemented in a single integrated circuit (IC), or distributed in multiple ICs of a system. The memory controller 206 and the memory controller 210 could be on the same IC and associated with the memory control circuit 203, or could be located with separate memory sub-systems having the first type of memory 208 and the second memory type 212. While only two types of memory are shown in FIG. 2 by way of example, it should be understood that the various circuits and methods can be implemented with more than 2 types of memory.

The memory control circuit 203 enables merging two data streams that have different bandwidth and latency characteristics. The circuits and methods set forth below enable both in-order and out-of order processing. In-order processing can be maintained by inserting artificial delay into the data streams to balance out the latency of all memory sub-systems. This delay requirement might require significant intermediate buffer space depending on the latency of a first memory sub-system, such as a memory sub-system having SSDs. If out-of-order processing is acceptable, all corresponding information relating to the memory request is streamed through the memory system, where responses from the memory sub-systems are merged back into an output data stream as soon as they are available. Additionally, overprovisioning can be used on the SSD interfaces, which are typically lower in throughput than a DRAM for example, where multiple SSD interfaces can be combined to increase bandwidth requirements to SSD.

One example of an arrangement of FIG. 2 includes SSDs as a first type of memory and DRAMs as a second type of memory. SSDs, such as NAND-based flash devices, are rapidly gaining popularity in memory networks as they provide both higher performance in terms of input/output operations per second (IOPS) and lower access latency than hard disk drives. They also provide greater storage density, lower cost and lower power consumption than a standard DRAM. However, one significant challenge in implementing the memory network with both types of memory is accommodating for different access latencies for the memories, where the access time for an SSD may be 10s of microseconds (us) compared to 10s of nanoseconds (ns) for a DRAM. By way of example, the latency of a memory chip may be specified. It is also possible to measure the latency of some DRAMs and SSDs. This data can be used to decide the delay buffer size. For example, some DRAMs might have latency around 600 nanoseconds, and some SSDs might have latency around 100 microseconds. Therefore, if the first data request goes to an SSD and the following requests go to a DRAM, then the DRAM data is available after 600 ns (i.e. earlier than the first data request to the SSD). In order to keep the order of the output data, the delay buffer coupled to DRAM controller buffers the data generated by the DRAM during the 100 us-600 ns (i.e. 99.4 us) period. Assuming that the DRAM has the bandwidth to output 512 bits (64 bytes) data every 240 ns, the delay buffer size should be 64*(99400/240)=26507 bytes. On an FPGAs having a BRAM with a size of 1024*4=4096 bytes, it would only be necessary to have (26507/4096)=7 BRAMs to buffer the data generated by the DRAM and provide the necessary delay to accommodate the latency of the SSD. Accordingly, the delay elements enable SSDs and DRAMs to be used together, where BRAMS of an FPGA (such as the FPGA shown in FIG. 16) can be used to provide the necessary delay to ensure that the correct data is generated as ordered output data. As described in more detail below, the data will not be read from the BRAM until the appropriate time so that the data from the BRAM is delayed by the correct amount of time with respect to the data from the SSD. While conventional multicore processors cannot compensate for these excessive access latencies through multithreading, devices having programmable resources such as the FPGAS described in FIG. 17 enables different types of memory having different latencies to the implemented together.

Figure 3:
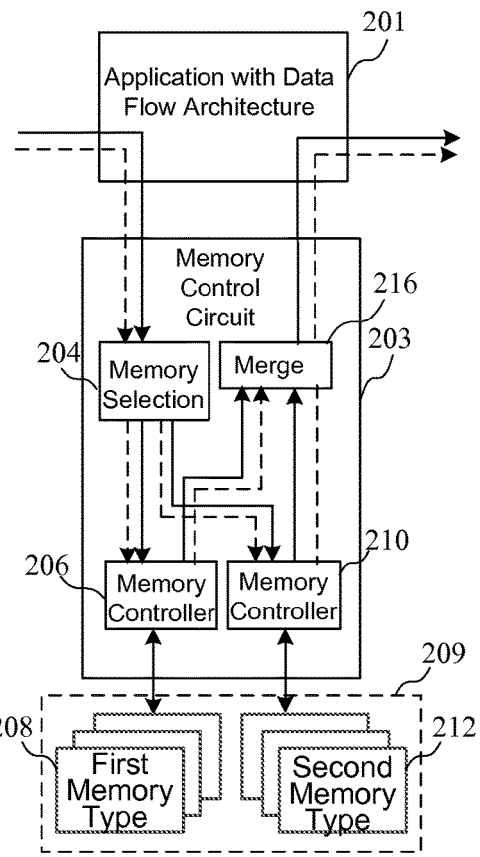
FIG. 3 is a block diagram of a circuit for controlling the operation of a memory system having different types of memory and enabling out-of-order processing.

As shown in FIG. 3, a metadata delay buffer is not required in a memory system having different types of memory and enabling out-of-order processing. Because the data is processed out-of-order and no delay is provided for data output by a memory, the metadata travels with the data in the memory controller, as shown by the dashed lines. That is, metadata is matched up with the data generated in response to a data request, and provided to the application 201.

The circuits and methods described in more detail below compensate for these large access latencies and enable SSDs to be used in combination with DRAM in a memory hierarchy. It is possible to create storage appliances, based on PLDs, that can process and store terabytes of data, at much lower cost, lower power and with increased compute and storage densities. Furthermore, the circuits and methods can provide this data up to the network with much lower access latencies than conventional arrangements.

A memory network may be implemented as a data flow architecture to compensate effectively for a large access latency of a given type of memory, and any large variation in access latencies without dropping performance by introducing delay using the memory control circuit 203. For example, delay may be introduced by using delay elements in form of FIFOs into the data flow architecture. Such an arrangement may be efficiently implemented in an integrated circuit, such as an FPGA, where a BRAM may be implemented as a FIFO. Because the BRAM may have no other function, there is no need to provide dedicated FIFOs to provide delay, but rather BRAMs (which are otherwise unused) can be implemented as FIFOs to provide any necessary delay. Further, the memory control circuit can determine whether an item is stored in a particular type of memory, and then forward the request onto the corresponding memory controller. As will be described in more detail below, this decision can be made on the basis of many different criteria, such as balancing out access bandwidths between DRAM and SSD, matching actual storage capacity to a particular use case, or balancing out current load conditions.

Figure 4:
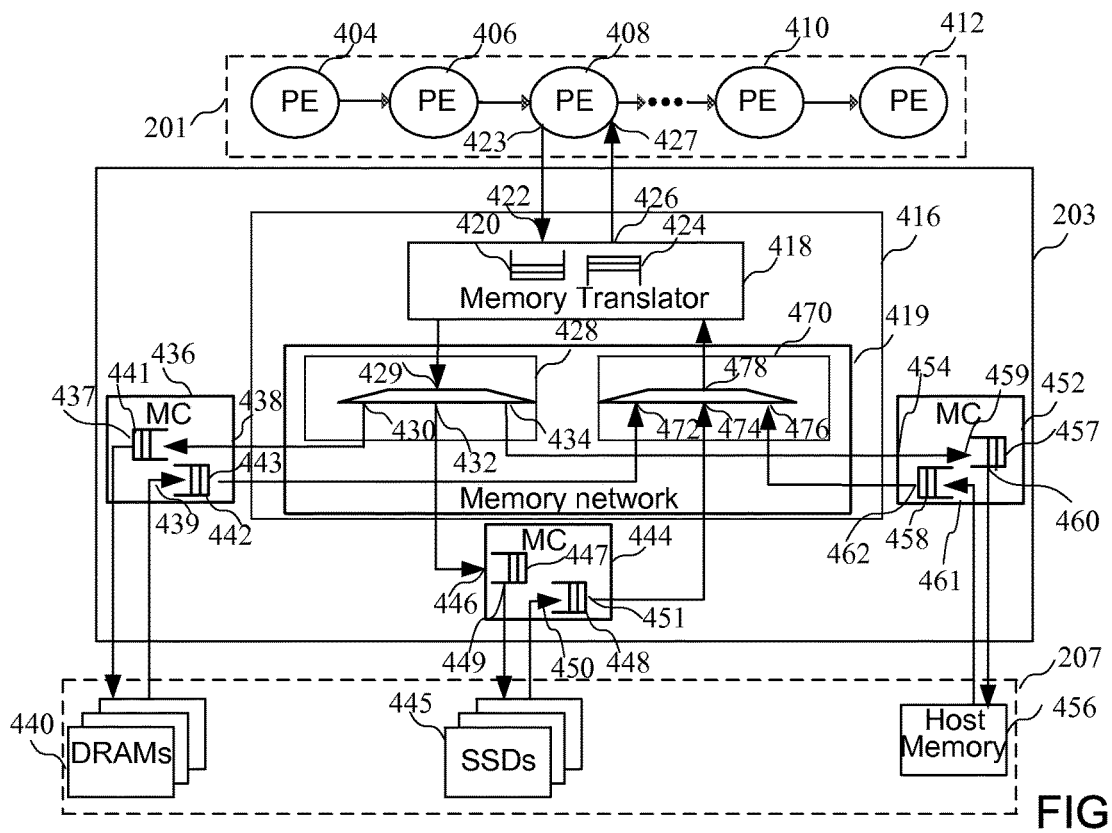
FIG. 4 is a block diagram of a circuit controlling the operation of a memory system having a circuit for accessing different types of memory.

Turning now to FIG. 4, a block diagram of a circuit controlling the operation of a memory system having a circuit for accessing different types of memory sub-systems is shown. As shown in FIG. 4, a memory control circuit 203 is coupled to a plurality of processing elements (PEs) 406-412 associated with the application 201. The PEs may be implemented in CLEs of an FPGA for example, as will be described in more detail in reference to FIGS. 18 and 19 set forth below. The memory control circuit 203 comprises a memory network circuit 416 having a memory translator 418. The memory translator 418 comprises a first buffer circuit 420 coupled to receive data requests from the processing element 408 at an input 422 from corresponding output 423 of the processing element. Data stored in a second buffer circuit 424 and generated at an output 426 is coupled to a corresponding input 427 of the processing element 408 as shown. The buffer circuits 420 and 424 of the memory translator 418, as well as buffers of the memory controllers described below, may be implemented in BRAMS of an FPGA. The amount of delay may vary, and can be selected based upon the number of BRAMS implemented as FIFOs to provide a selected delay. That is, the memory controller 203 enables the selection of a path which provide a certain known delay at an output of a memory by selecting a path from the output of a memory to include BRAMS implemented as FIFOs which have a certain delay. In the event that a delay is not necessary (i.e. for an out-of-order processing), the delay elements are bypassed using interconnect elements that enable routing around the delay elements, for example. The data output by the different memories is then combined by the memory translator 418 to enable in-order processing, where the ordered data outputs may be stored in the buffer 424.

The memory translator 418 is coupled to the memory network 419 to enable the control of signals routed to and from memory controlled by the memory translator. In particular, a first selection circuit 428, shown here by way of example as a multiplexer, is coupled to and controlled by the memory translator 418, and more particularly is coupled to receive a memory access request at a first input 429. The memory access request may them be routed to one of a plurality of memory controller (MC) circuits at a plurality of corresponding outputs 430-434 of the selection circuit 428. The output 430 is coupled to a memory controller 436 at an input 438. An output 437 of a buffer circuit 441 is coupled to the plurality of memories 440, shown here as Dynamic Random Access Memories (DRAMs), where the memory controller controls the plurality of memories 440. It should be noted that the DRAMs are volatile memory. The buffer circuit 442 is coupled to receive output of the plurality of memories 440 at an input 439, and generate data at an output 443 for the memory translator 418. Buffer circuits 441 and 442 may be implemented to store requests routed to the memory or data received from the memory elements before the data can be routed back to the memory translator. Because the DRAMs have a faster access rate than SSDs, the buffer 442 enables providing a delay so that the memory translator can provide the correct data in the correct order for in-order processing.

A second memory controller 444 is coupled to the memory network 419 and a second plurality of memories 445 at an input 446, where the plurality of memories are shown by way of example as SSDs, which are non-volatile memory that retain the stored data after power is removed from the memory. Buffers 447 and 448 enable storing data requests received from the memory translator 418 or data received from the memories 445, as set forth above with respect to memory controller 436. In particular, data requests from the memory translator may be provided to an input 446 of the buffer 447 and generated at an output 449, while data generated at an output of the plurality of memories 445 is coupled to an input 450 of the buffer 448, where the data may be generated at an output 451. Finally, a third memory controller 452 is coupled to the memory network 419 at an input 454 and a host memory 456. Data requests received from the memory controller 452 may be stored in buffer circuit 457, where a data request provided to an input 459 of the buffer 457 may generated at an output 460 and coupled to the host memory 456. Similarly, data received from the host memory at an input 461 may be generated at an output 462 of the buffer circuit 458 to be routed to the memory translator 418.

A second selection circuit 470, shown here as a multiplexer, is coupled to the memory translator, and more particularly is coupled to receive outputs of memories 440, 445, and 456 at inputs 472-476, where a selected output is generated at an output 478. An output of a selected memory is provided to an input of the memory translator 418. The memory allocator controls the selection circuit 470 to ensure that the correct data is accessed from a particular memory so that the data is provided in the correct order for in-order processing. While particular memory elements are shown by way of example, it should be understood that other types of memory elements could be controlled by the memory control circuit 203.

Figure 5:
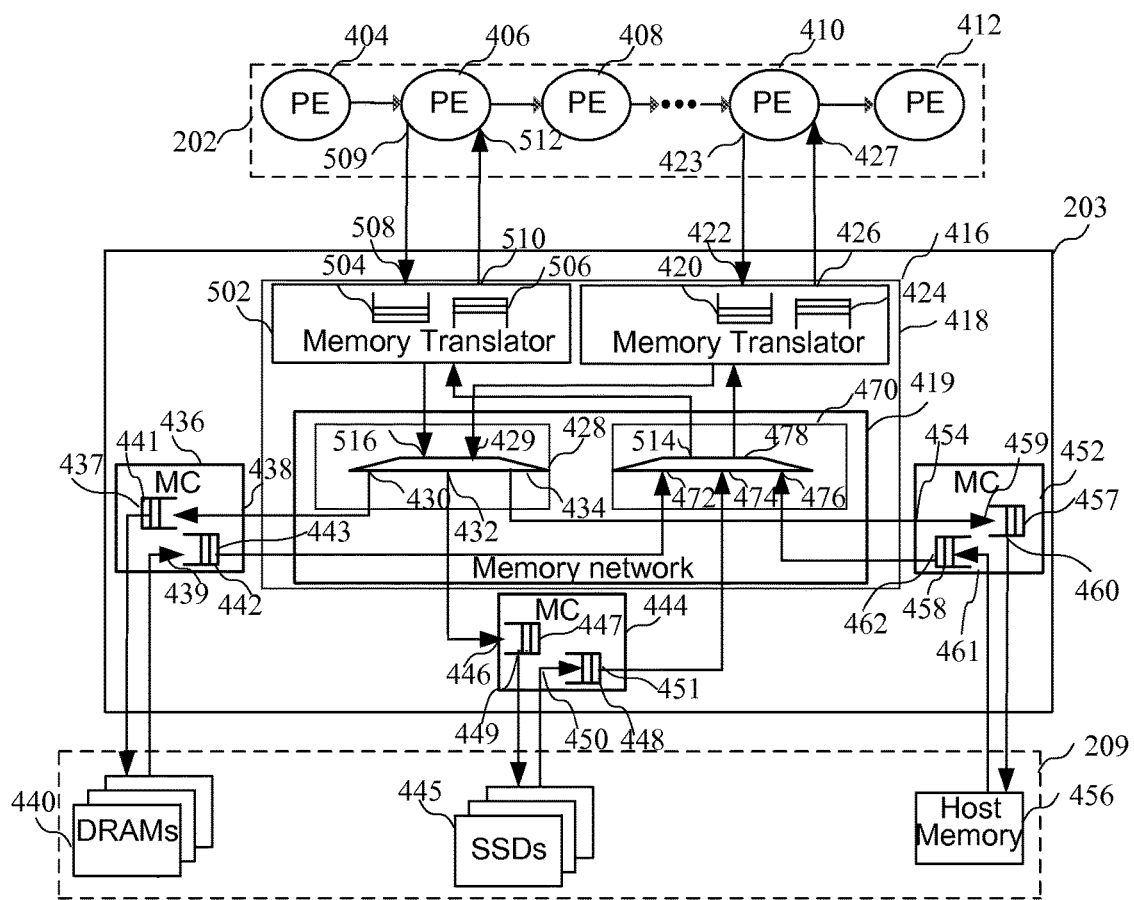
FIG. 5 is another block diagram of a circuit controlling the operation of a memory system having a circuit for accessing different types of memory.

Turning now to FIG. 5, another block diagram of a circuit controlling the operation of a memory system having a circuit for accessing different types of memory is shown. A second memory translator 502 is associated with another processing element, shown here as processing element 406. The memory translator comprises a first buffer 504 and a second buffer 506. The first buffer is coupled to receive a data request at a first input 508 from an output 509 of the processing element 406. A second buffer 506 is coupled to generate data at a first output 510 which is coupled to an input 512 of the second processing element 406. The memory translator 502 is also coupled to the memory network 419 to enable the control of signals routed to and from memory controlled by the memory translator 502. That is, an output 514 of the second selection circuit 470 is coupled to the memory translator 502, while an output of the memory translator 502 is coupled to an input 516 of the selection circuit 428. It should be understood that more than two memory translators could be implemented, and that the outputs of a memory translator could be coupled to a different processing element.

Figure 6:
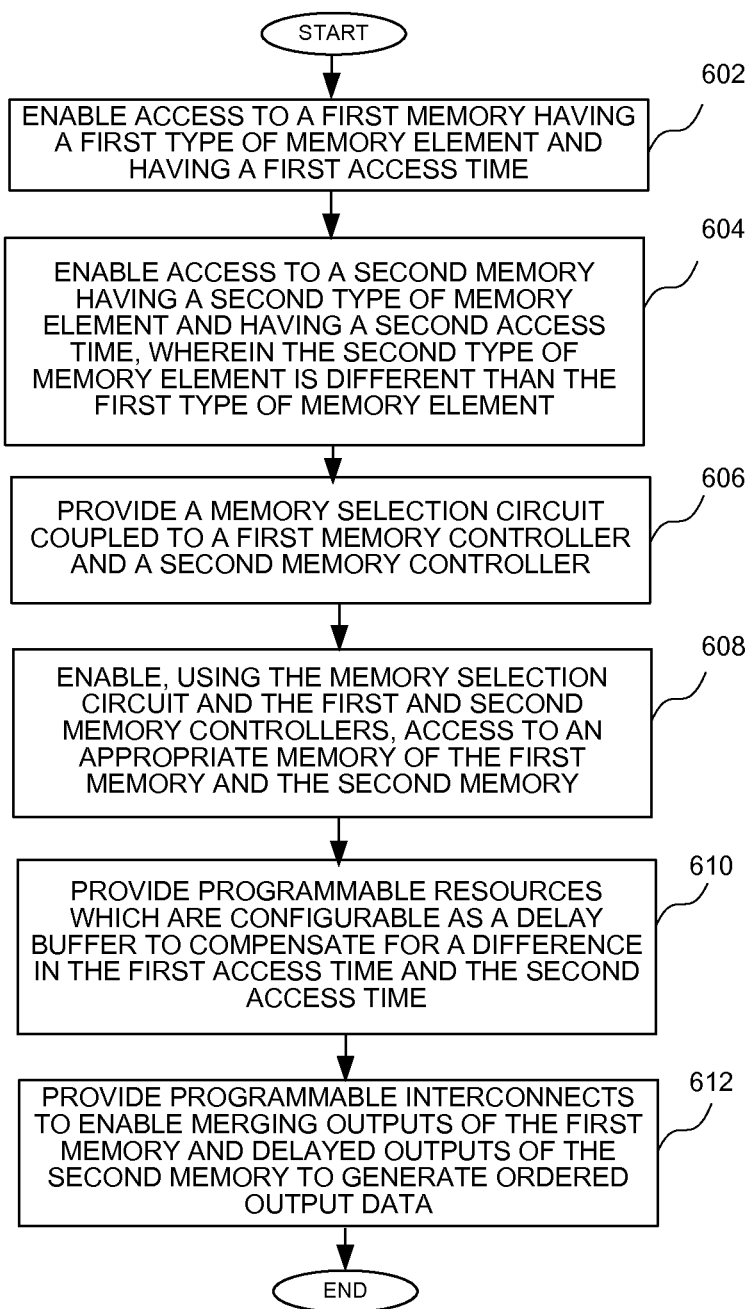
FIG. 6 is a flow chart showing a method of implementing a memory system having different types of memory.

Turning now to FIG. 6, a flow chart shows a method of controlling the operation of a memory system. Access to a first memory having a first type of memory element and having a first access time is enabled at a block 602. Access to a second memory having a second type of memory element and having a second access time is enabled at a block 604, wherein the second type of memory element is different than the first type of memory element. Access to the first and second memories can be provided by input/output circuits, such as IOBs of the integrated circuit of FIG. 18, for example. A memory selection circuit coupled to the first memory controller and the second memory controller is provided at a block 606, where the selection circuit may be a multiplexer, for example. Access to an appropriate memory of the first memory and the second memory is enabled, using the memory selection circuit and the first and second memory controllers, at a block 608. Programmable resources which are configurable as a delay buffer are provided to compensate for a difference in the first access time and the second access time at a block 610. Programmable interconnects are provided to enable merging outputs of the first memory and delayed outputs of the second memory to generate ordered output data at a block 612. An example of programmable resources which could be implemented as a delay buffer include the BRAMS of the PLD of FIG. 18, while an example of programmable interconnects could include the programmable interconnects of the PLD of FIG. 18.

Figure 7:
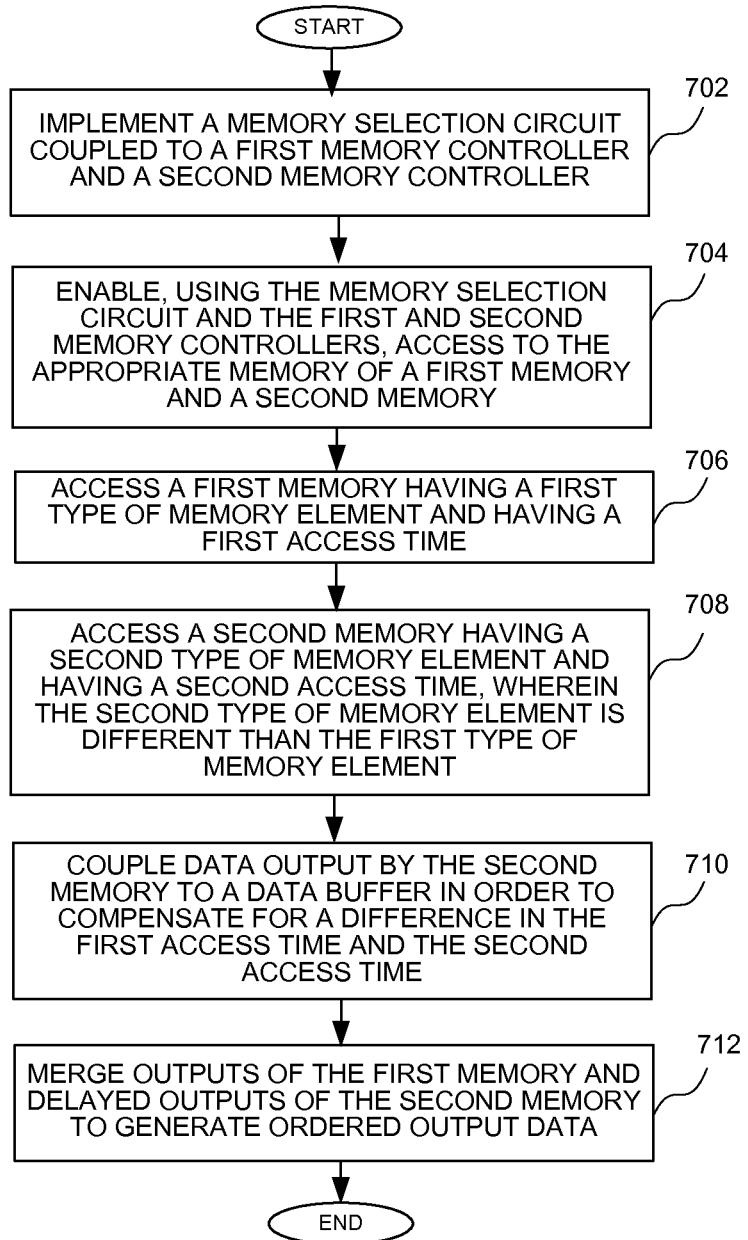
FIG. 7 is a flow chart showing a method of controlling the operation of a memory system having different types of memory.

FIG. 7 is a flow chart showing a method of controlling the operation of a memory system having different types of memory. A memory selection circuit coupled to a first memory controller and a second memory controller is implemented at a block 702. Access to an appropriate memory of a first memory and a second memory is enabled, using the memory selection circuit and the first and second memory controllers, at a block 704. For example, control signals are provided to the memory selection circuit to ensure that data is routed to or received from the correct memory. A first memory having a first type of memory element and having a first access time is accessed at a block 706. A second memory having a second type of memory element and having a second access time is accessed at a block 708, wherein the second type of memory element is different than the first type of memory element. Data output by a second memory is coupled to a delay buffer in order to compensate for a difference in the first access time and the second access time at a block 710. For example, the delay buffer could be implemented as a BRAM of an integrated circuit, such as a BRAM of the integrated circuit of FIG. 18, which effectively provides an appropriate delay by enabling a read of the BRAM at the correct time. That is, if data from the DRAM is buffered in the BRAM but data from the SSD (which must be read first) is not ready, a read enable circuit of the BRAM will not be asserted, and the data will be held for a predetermined delay. Accordingly, the data may be delayed by the BRAM by buffering the data in the BRAM, and the data is read from the BRAM after the predetermined delay. Outputs of the first memory and delayed outputs of the second memory are merged to generate ordered output data at a block 712.

The various elements of the methods of FIGS. 6 and 7 may be implemented using the circuits of FIGS. 1-5 as described, or using some other suitable circuits. While specific elements of the method are described, it should be understood that additional elements of the method, or additional details related to the elements, could be implemented according to the disclosure of FIGS. 1-5.

Figure 8:
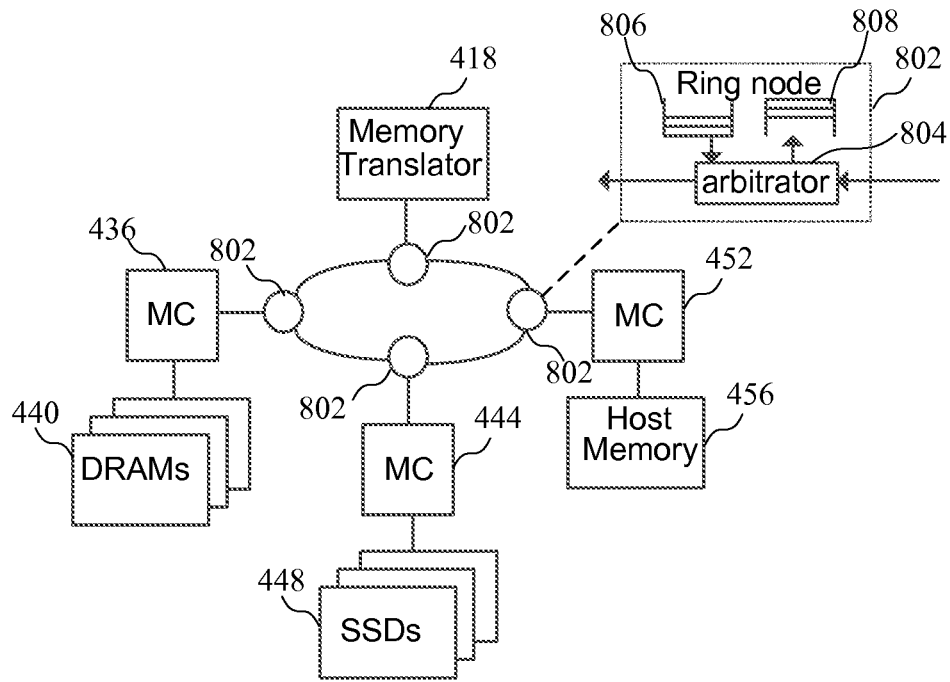
FIG. 8 is a block diagram showing a circuit for allocating memory in a ring-node implementation.

Turning now to FIG. 8, a block diagram of a circuit for allocating memory in a ring-node implementation is shown. The circuit of FIG. 8 shows an arrangement of elements, where a node 802 of the ring-node implementation is shown in more detail. In particular, each node 802 comprises an arbitrator 804 coupled to an input buffer 806 and an output buffer 808. The arbitrator 804 provides an interface between the buffers 806 and 808 for routing data to or receiving data from another node (such as a memory controller or the memory translator) on the ring. The circuit of FIG. 8 implements basic token ring, and the arbitrator transmits the data from a sending buffer to the ring once it receives some specific data (i.e. a token), and will transmit the data from ring to the input buffer once it determines that the destination address is the address at its node. The token ring arrangement of FIG. 8 could be applied to both in-order processing or out-of-order processing. While the methods of FIG. 6 can be implemented in different topologies, such as ring, mesh or torus topologies, the ring interconnect topology of FIG. 7 generally uses less routing resources and has predictable latency. Further, the ring topology is beneficial when there is a significant number of memory nodes in the system.

Figure 9:
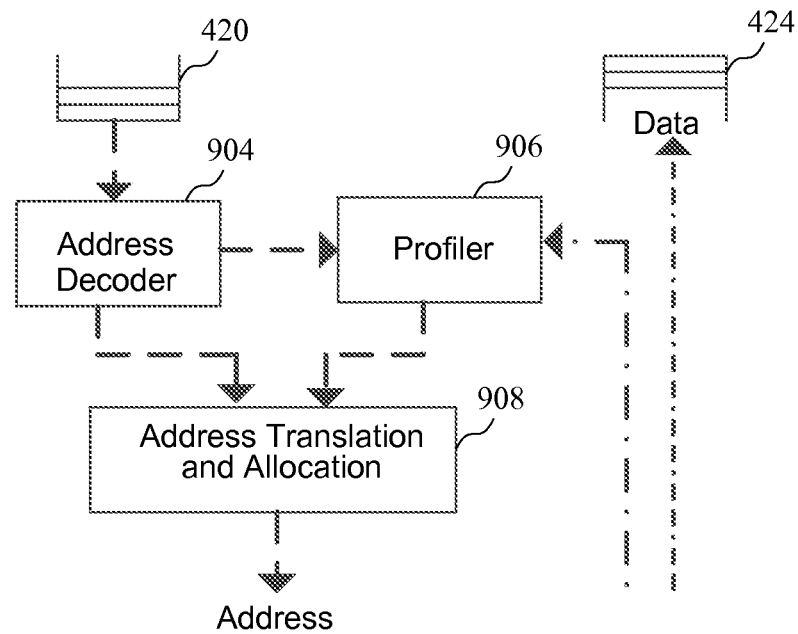
FIG. 9 is a block diagram showing the architecture of a memory translator.

Turning now to FIG. 9, a block diagram shows the architecture of the memory translator 418. In particular, the input buffer 420 is coupled to an address decoder 904 and provides a request for storing data in a memory. An output of the address decoder 904 is coupled to a profiler 906 and an address translation and allocation block 908. As will be described in more detail in reference to FIG. 10, the profiler 906 enables optionally determining which memory is used for storing data to optimize the operation of the memory network. An address is output from the address translation and allocation block 908 in response to the address decoder 904 and the profiler 910. That is, the address translation and allocation block 908 will determine which of the memories 440, 445, and 456 are accessed. The output buffer 424 is coupled to receive an output of a memory.

Figure 10:
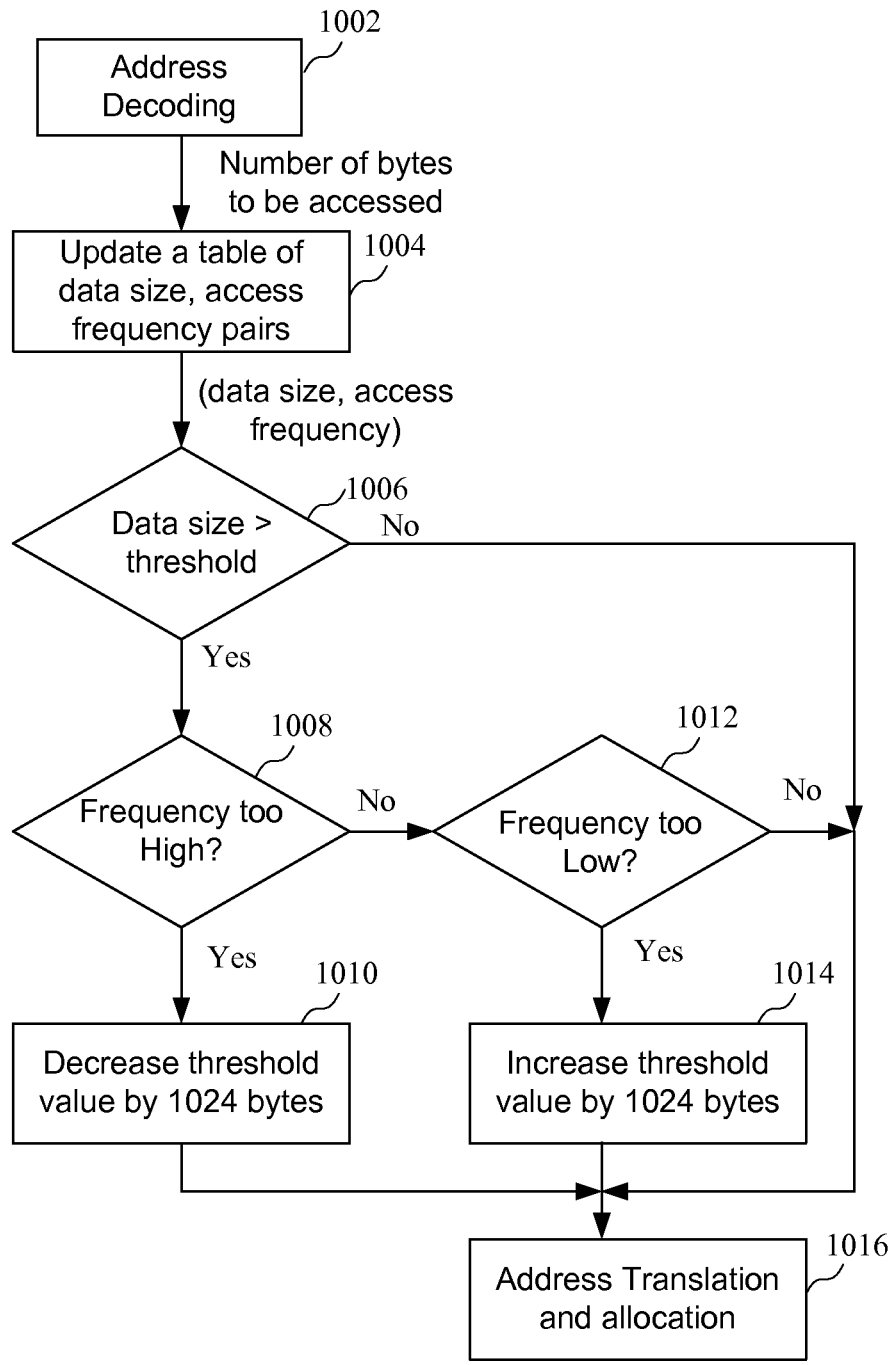
FIG. 10 is a flow chart showing the operation of a profiler of the memory translator of FIG. 9.

The profiler 906 enables analysis of memory sub-systems to determine which memory, such as a fast access memory (e.g. a DRAM) and a slower access memory (e.g. an SSD), to access. Based upon observations of the memory performance, the memory sub-systems can be implemented such that they support predetermined amounts of data. For example, when implementing DRAMs and SSDs in a memory network, a memcached implementation shows that some SSDs can support 1% of the data requests of a 10 gigabit per second (Gbps) data interface for accessing data. That is, if 1% of the 10 Gbps memcached requests cause the value to be retrieved from SSD, then the memcached requests can still produce 10 Gbps responses. By way of example, a value size of 2 kilobytes (Kbytes) may be used as threshold to split memory accesses. That is, if the requests retrieve a value that is bigger than 2KB, they will access an SSD, otherwise, they will access a DRAM. However, when actually implemented, if the requests that retrieve a bigger value (i.e. bigger than 2KB in this case) exceed 1% of the data requests, then it is necessary to increase the threshold by some value. For example, the threshold can be increased by 1024 Bytes (i.e. 1 KB) for example to ensure that only 1% of the accesses are made for data stored in the SSDs. The flow diagram of FIG. 10 shows the modification of a threshold to enable optimal performance. It assumes some access frequency (e.g. 1% for the SSD and 99% for the DRAM), and builds a map between access frequency and the data size. Then, if a data access size is smaller than the threshold, the access is for a DRAM. However, if the data access size is greater than the threshold, the access frequency for that data size will be checked to determine if it is necessary to adjust the threshold value. If the frequency is too high, the threshold will be reduced. If the frequency is too low, then the threshold will be increased.

In particular, address decoding is performed at a block 1002, where a number of bytes to be accessed is determined. A table of data size and access frequency pairs is updated at a block 1004, where data size and access frequency data is generated. The sizes (i.e. number of bytes) are used to divert the memory accesses to different memory types, such as DRAMs or SSDs. Further, different memories (e.g. DRAMs or SSDs) have different access granularity, which is number of bytes to be accessed. For example, SSDs demonstrate page-wise (e.g. 4K bytes) access granularity. Therefore, if one byte is retrieved from an SSD (which can generate 4 Kbytes of data in an access), essentially the same time as required to access a page is required to access the one byte, and the memory performance is very low as most of the memory access bandwidth is wasted. It is then determined whether the data size is greater than a threshold at a block 1006. If so, it is determined whether the frequency is too high at a block 1008. If the frequency is too high, the threshold register minus 1024 bytes is recorded at a block 1010. If the frequency is not too high, it is determined whether the frequency is too low at a block 1012. If the frequency is too low, the threshold register plus 1024 bits is recorded at a block 1014. Address translation is then performed at a block 1016, where data is stored in an appropriate type of memory depending upon the size of the data and the threshold value.

Figure 11:
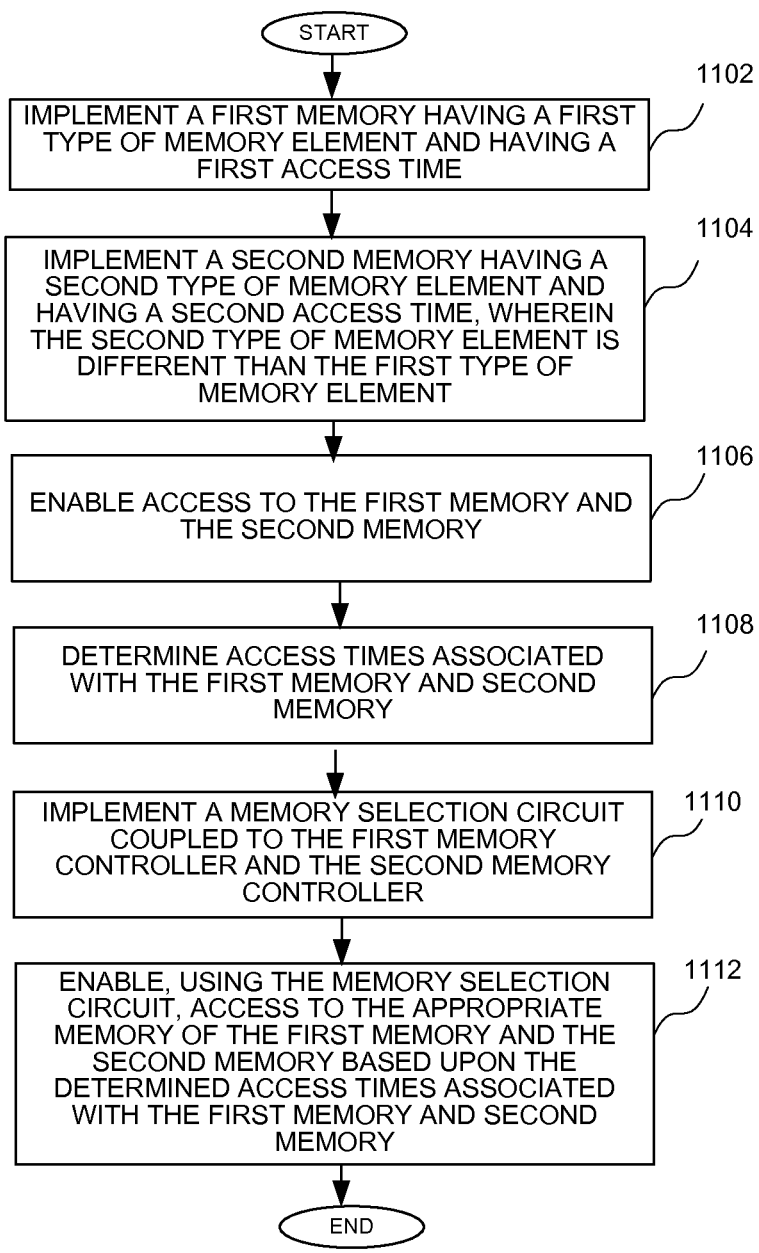
FIG. 11 is a flow chart showing a method of determining a memory of a plurality of memories in which data is stored.

When implementing a system having different types of memory, it must be determined in which type of memory particular data should be stored. The flow chart of FIG. 11 shows a method of determining a memory of a plurality of memories in which data is stored. A first memory having a first type of memory element and having a first access time is implemented at a block 1102. A second memory having a second type of memory element and having a second access time is implemented at a block 1104, wherein the second type of memory element is different than the first type of memory element. Access to the first memory and the second memory is enabled at a block 1106. The first and second types of memory could be NAND and SSD memories as described in reference to FIGS. 4 and 5, for example. Access times associated with the first memory and second memory are determined at a block 1108. The access times associated with the different types of memory may be provided by a manufacturer of the memory device or determined during the operation of the memory device, for example. A memory selection circuit coupled to the first memory controller and the second memory controller is implemented at a block 1110. Access to the appropriate memory of the first memory and the second memory is enabled, using the memory selection circuit at a block 1112. The appropriate memory is accessed based upon certain criteria, such as the determined access times associated with the first memory and second memory and the size of the data to be stored. Accordingly, data can be stored in a particular memory, such as a DRAM or SSD memory based upon the access time of the memory and the size of the data, as described in more detail below. For example, data consisting of multiple page sizes may be stored in an SSD, while smaller data is stored in DRAM. Further, a memory translator can determine a threshold of the size of the smaller data to be stored in a DRAM as described above in FIG. 10.

Figure 12:
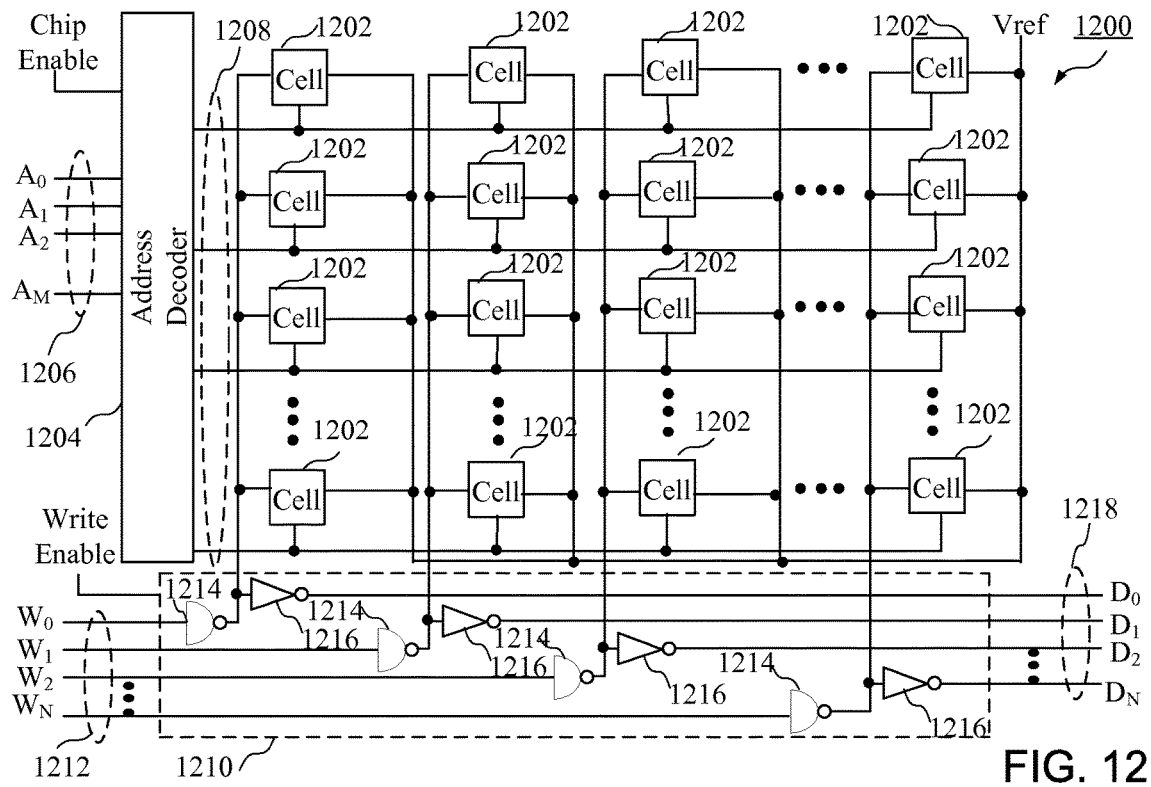
FIG. 12 is a block diagram of a dynamic random access memory (DRAM)

Turning now to FIG. 12, a block diagram of a DRAM is shown. The DRAM block 1200 comprises a plurality of memory cells 1202, each of which is coupled to an address decoder 1204. The address decoder 1104 receives address lines 1206, and generates an address which is coupled to the plurality of memory cells 1202 as is shown. The address decoder 1204 receives a chip enable signal, and each of the memory cells 1102 receives a reference voltage Vref. A write block 1210 enables the reading of data from or the writing of data to the memory cells 1202. In particular, data provided by way of data lines 1212 are written to an address provided to an address decoder if a write enable signal provided to the write block 1210 enables writing to the memory cells 1202 by way of the gates 1214. If the write enable signal is not enabling writing to the memory cells 1202, data coupled to inverters 1216 is generated on data lines 1218. As will be described in more detail below, data stored in the cells of the DRAM block must be periodically refreshed to retain the data.

Figure 13:
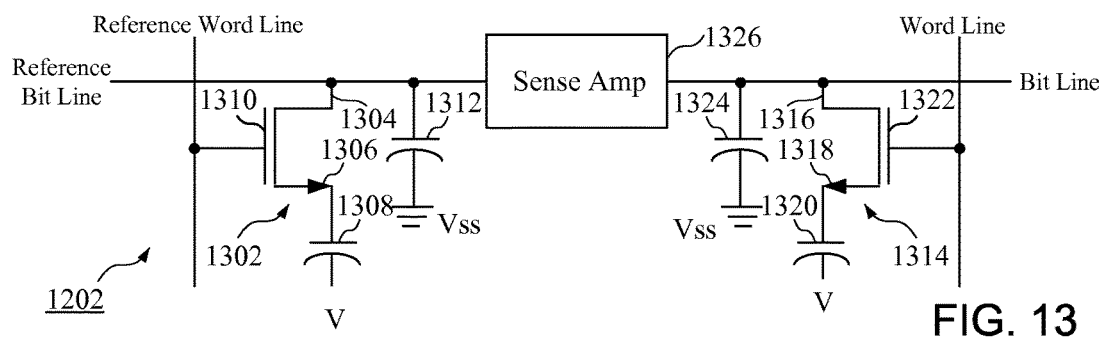
FIG. 13 is a block diagram of a memory element of the DRAM of FIG. 12.

Turning now to FIG. 13, a block diagram of a memory element of the DRAM of FIG. 12 is shown. In particular, a first transistor 1302 has a drain 1304 coupled to a reference bit line and a source 1306 coupled to a capacitor 1308. The transistor 1302 is controlled at a gate 1310 by a reference word line. A second transistor 1314 has a drain 1316 coupled to a bit line and a source 1318 coupled to a capacitor 1320. The transistor 1314 is controlled at a gate 1322 by a word line. Data is written by pulling the word line high, and applying the desired value to be stored to the bit line to charge the capacitor 1320. In order to read data from the memory, the sense amp 1326 will detect a difference between the voltage stored on the capacitor 1312 at the reference bit line and the voltage stored on the capacitor 1324 at the bit line to generate an output value. After the value of the bit line is determined, that value is re-written to the bit line by storing the appropriate charge on the capacitor 1324. That is, the capacitor 1324 is periodically recharged to maintain the correct value of data stored by the cell. The DRAM memory cell must be periodically refreshed to maintain the charge on the capacitor representing the stored data, but may have a shorted access time than an SSD memory cell.

Figure 14:
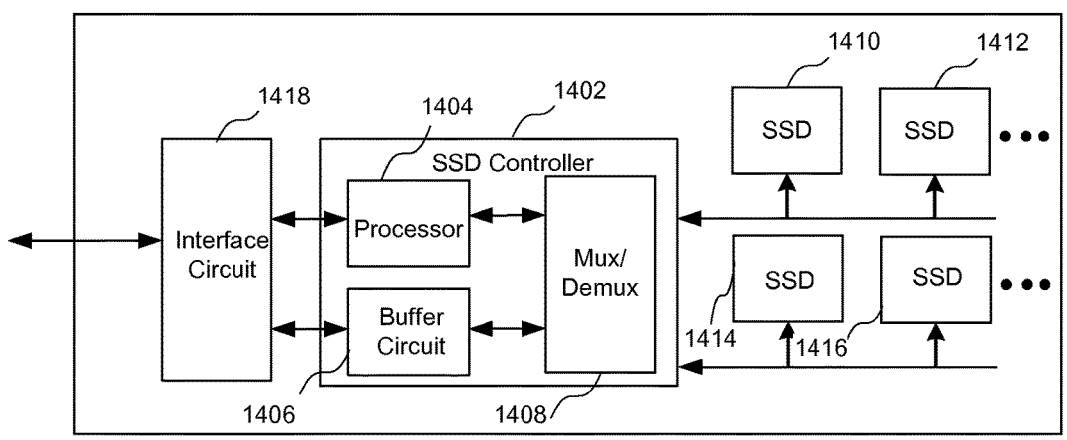
FIG. 14 is a block diagram of a solid-state drive (SSD) memory.

Turning now to FIG. 14, a block diagram of an SSD memory is shown. The SSD comprises an SSD controller 1402 having a processor 1404 and buffer circuit 1406, each of which interfaces with a multiplexer/demultiplexer 1408. The multiplexer/demultiplexer circuit 1408 receives data from and provides data to one of a plurality of SSDs 1410-1416. An interface circuit 1418 enables the transfer of data between the SSD and a memory interface of a device, such as a memory controller of the memory control circuit 203.

Figure 15:
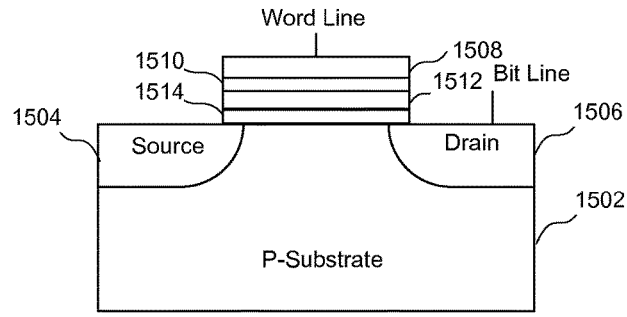
FIG. 15 is a block diagram of a memory element of the solid-state drive of FIG. 14.

Turning now to FIG. 15, a block diagram of a memory element of the SSD of FIG. 14 is shown. The memory element of FIG. 15 comprises a substrate 1502 having a source 1504 and a drain 1506 which is controlled by a bit line. A word line controls a gate element having a control gate 1508 separated by an oxide layer 1510 from a floating gate 1512 on an oxide layer 1514. While examples of circuits associated with DRAM and SSD memory devices are provided, it should be understood that other circuits could be implemented.

Figure 16:
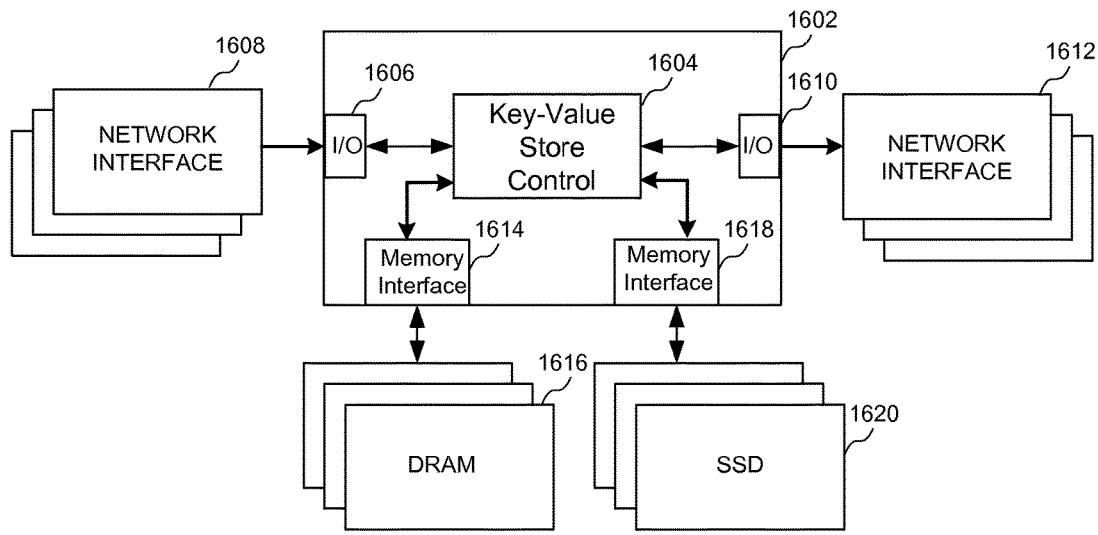
FIG. 16 is a block diagram of a circuit for enabling a key-value store implementing a plurality of memory types.

FIG. 16 is a block diagram of a circuit for enabling a key-value store implementing a plurality of memory types. A key-value store enables storing and retrieving values having associated keys (rather than indexed with addresses) over a communication or network interface. An integrated circuit 1602 may be implemented with a key-value store control circuit 1604 which interfaces with an I/O block 1606 coupled to one or more network interfaces 1608 for receiving data and an I/O block 1610 coupled to one or more network interfaces 1612 for outputting data. The key-value store control circuit 1604 can be implemented according to the memory control circuit 203, as set forth above. According to the implementation of FIG. 16, a memory interface 1614 enables communicating with one or more memory devices of a first plurality of memory devices 1616, shown here as DRAMs, and a second memory interface 1618 communicating with one or more memory devices of a second plurality of memory devices 1620, shown here as SSDs.

SSDs provide many benefits including lower cost and power consumption. However, more importantly, SSDs allow a key-value store to provide a significantly larger storage density (such as 500 GB memory) over fewer pins (for example 4 pins). That is, because SSDs utilize a high-speed serial interface such as serial advanced technology attachment (SATA), serial attached SCSI (SAS), or peripheral component interconnect express (PCIe), few input/output (I/O) pins are required. In contrast, a DRAM small outline dual in-line memory module (SODIMM) interface requires around 140 I/O pins to connect 8 GB of storage. While an SSD generally has a slower access speed compared to a DRAM, the operation of the circuit can be improved when data is stored in a memory device for which it is suited, such as when larger data blocks are stored in SSDs.

The memory interfaces 1614 and 1618 could be implemented as described above in reference to FIG. 2, for example. While DRAMs and SSDs are shown by way of example, it should be understood that other types of memory elements could be implemented, where the selection of a particular type of memory device is based upon operating parameters of the memory devices.

The selection of one or more memory elements for accessing data of a key-value store enables efficient operation of the key-value store by considering the access properties of different memory devices to determine which types of memory device to use for various data of the key-value store. According to one implementation, the memory management circuit divides a data block into a first data portion and a second data portion, where the first data portion and the second data portion are provided to different memory types. According to another implementation, data (either as a full data block or a portion of a data block) is routed to a selected memory type based upon access criteria, such as the speed or frequency of access for example.

One important aspect of SSDs is related to its block-wise access characteristic and a low I/O pin requirement. While this access characteristic may detrimental in some applications for implementing a key-value store, this access characteristic can be used advantageously in other applications. For example, accesses on an SSD that are smaller than page sizes (e.g. a 4 kilobyte page size), can become very inefficient. Therefore, to maximize the access performance, DRAMs are provided in addition to the SSDs to distribute the data between DRAMs and SSDs. However, DRAMs have a greater I/O pin requirement to transfer data. Accordingly, the selection of memory elements in the hybrid implementation may take a number of factors into account.

According to one implementation, the data accessed or stored in a key-value store is divided into 2 portions. The portion of the value that consists of multiple page sizes is stored in the SSD, while the remainder is stored in DRAM. Therefore, the SSD is only accessed in full page sizes, maximizing the access performance. While it may be necessary to maintain a list and move values between DRAM and SSD, the hybrid architecture provides significantly improved performance.

Figure 17:
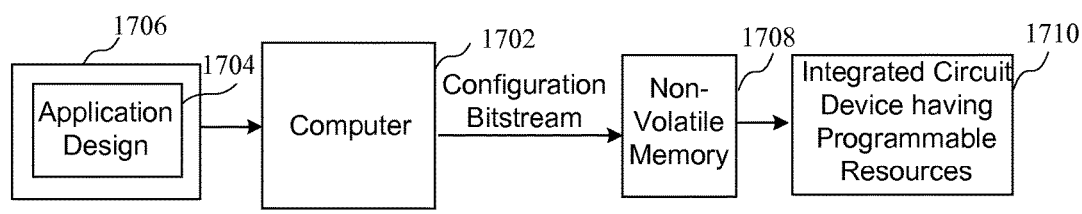
FIG. 17 is a block diagram of a system for programming a device having programmable resources.

Turning now to FIG. 17, a block diagram of a system for programming a device having programmable resources according to an arrangement is shown. In particular, a computer 1702 is coupled to receive a circuit design 1704 from a memory 1706, and generates a configuration bitstream that is stored in the non-volatile memory 1706. As will be described in more detail below, the circuit design may be a high level design, such as a circuit design defined in a hardware description language (HDL). Also, the computer may be configured to run software that generates a configuration bitstream that is stored in the non-volatile memory 1708 and provided to an integrated circuit 1710 that may be a programmable integrated circuit, such as the integrated circuit described below in FIG. 18. As will be described in more detail below, bit of the configuration bitstream are used to configure programmable resources of the integrated circuit.

Figure 18:
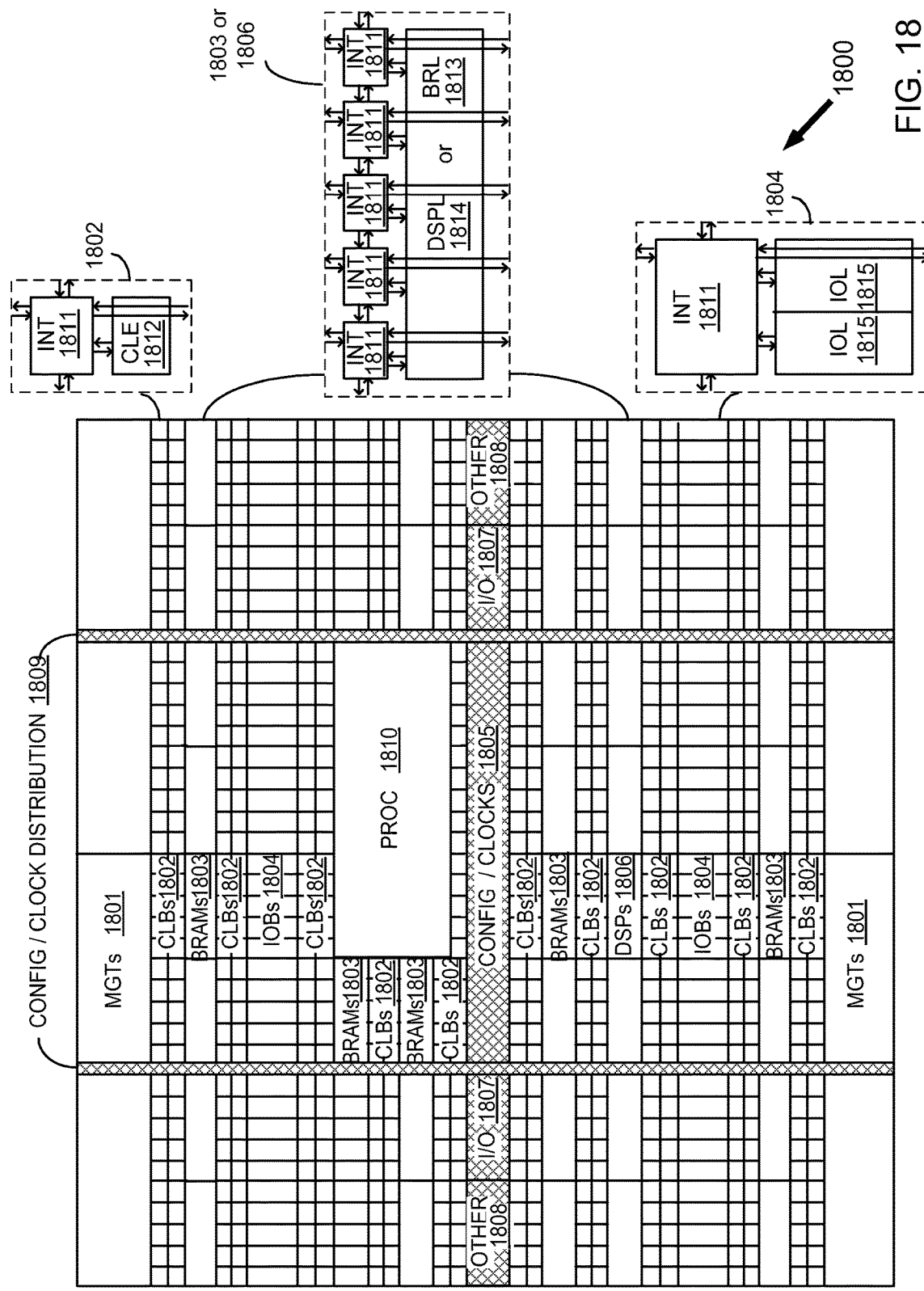
FIG. 18 is a block diagram of a device having programmable resources.

Turning now to FIG. 18, a block diagram of a device having programmable resources including the circuits of FIGS. 1-5 is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 18 comprises an FPGA architecture 1800 having a large number of different programmable tiles including multi-gigabit transceivers (MGTs) 1801, CLBs 1802, random access memory blocks (BRAMs) 1803, input/output blocks (IOBs) 1804, configuration and clocking logic (CONFIG/CLOCKS) 1805, digital signal processing blocks (DSPs) 1806, specialized input/output blocks (I/O) 1807 (e.g., configuration ports and clock ports), and other programmable logic 1808 such as digital clock managers, analog-to-digital converters, system monitoring logic, and so forth. Some FPGAs also include dedicated processor blocks (PROC) 1810, which may be used to implement a software application, for example.

In some FPGAs, each programmable tile includes a programmable interconnect element (INT) 1811 having standardized connections to and from a corresponding interconnect element in each adjacent tile. Therefore, the programmable interconnect elements taken together implement the programmable interconnect structure for the illustrated FPGA. The programmable interconnect element 1811 also includes the connections to and from the programmable logic element within the same tile, as shown by the examples included at the top of FIG. 18.

For example, a CLB 1802 may include a configurable logic element (CLE) 1812 that may be programmed to implement user logic plus a single programmable interconnect element 1811. A BRAM 1803 may include a BRAM logic element (BRL) 1813 in addition to one or more programmable interconnect elements. The BRAM includes dedicated memory separate from the distributed RAM of a configuration logic block. Typically, the number of interconnect elements included in a tile depends on the height of the tile. In the pictured arrangement, a BRAM tile has the same height as five CLBs, but other numbers may also be used. A DSP tile 1806 may include a DSP logic element (DSPL) 1814 in addition to an appropriate number of programmable interconnect elements. An IOB 1804 may include, for example, two instances of an input/output logic element (IOL) 1815 in addition to one instance of the programmable interconnect element 1811. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured arrangement, a columnar area near the center of the die is used for configuration, clock, and other control logic. The config/clock distribution regions 1809 extending from this column are used to distribute the clocks and configuration signals across the breadth of the FPGA. Some FPGAs utilizing the architecture illustrated in FIG. 18 include additional logic blocks that disrupt the regular columnar structure making up a large part of the FPGA. The additional logic blocks may be programmable blocks and/or dedicated logic. For example, the processor block PROC 1810 shown in FIG. 18 spans several columns of CLBs and BRAMs.

Note that FIG. 18 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 18 are purely exemplary. For example, in an actual FPGA more than one adjacent column of CLBs is typically included wherever the CLBs appear in order to facilitate the efficient implementation of user logic. While the arrangement of FIG. 18 relates to an integrated circuit having programmable resources, it should be understood that the circuits and methods set forth in more detail below could be implemented in any type of ASIC.

Figure 19:
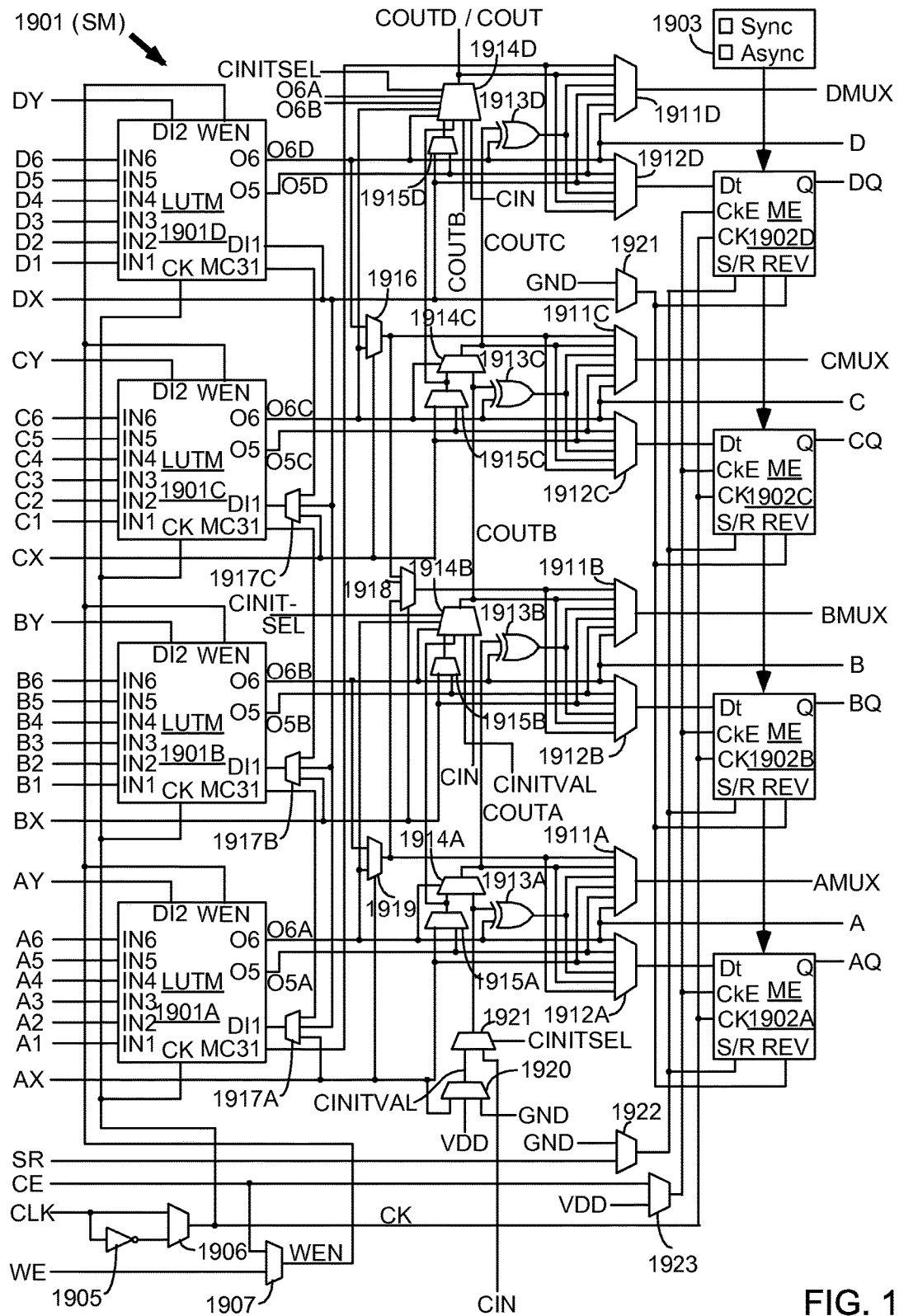
FIG. 19 is a block diagram of a configurable logic element of the device of FIG. 18.

Turning now to FIG. 19, block diagram of a configurable logic element of the device of FIG. 18 is shown. In particular, FIG. 19 illustrates in simplified form a configurable logic element of a configuration logic block 1802 of FIG. 18. In the arrangement of FIG. 19, slice M 1901 includes four lookup tables (LUTMs) 1901A-1901D, each driven by six LUT data input terminals A1-A6, B1-B6, C1-C6, and D1-D6 and each providing two LUT output signals O5 and O6. The O6 output terminals from LUTs 1901A-1901D drive slice output terminals A-D, respectively. The LUT data input signals are supplied by the FPGA interconnect structure via input multiplexers, which may be implemented by programmable interconnect element 1911, and the LUT output signals are also supplied to the interconnect structure. Slice M also includes: output select multiplexers 1911A-1911D driving output terminals AMUX-DMUX; multiplexers 1912A-1912D driving the data input terminals of memory elements 1902A-1902D; combinational multiplexers 1916, 1918, and 1919; bounce multiplexer circuits 1922-1923; a circuit represented by inverter 1905 and multiplexer 1906 (which together provide an optional inversion on the input clock path); and carry logic having multiplexers 1914A-1914D, 1915A-1915D, 1920-1921 and exclusive OR gates 1913A-1913D. All of these elements are coupled together as shown in FIG. 19. Where select inputs are not shown for the multiplexers illustrated in FIG. 19, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 19 for clarity, as well as from other selected figures herein.

In the pictured arrangement, each memory element 1902A-1902D may be programmed to function as a synchronous or asynchronous flip-flop or latch. The selection between synchronous and asynchronous functionality is made for all four memory elements in a slice by programming Sync/Asynch selection circuit 1903. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1902A-1902D are clocked by a clock signal CK, which may be provided by a global clock network or by the interconnect structure, for example. Such programmable memory elements are well known in the art of FPGA design. Each memory element 1902A-1902D provides a registered output signal AQ-DQ to the interconnect structure. Because each LUT 1901A-1901D provides two output signals, O5 and O6, the LUT may be configured to function as two 5-input LUTs with five shared input signals (IN1-IN5), or as one 6-input LUT having input signals IN1-IN6.

In the arrangement of FIG. 19, each LUTM 1901A-1901D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1917A-1917C for LUTs 1901A-1901C), or to the two 32-bit RAMs via input terminals DI1 and DI2. RAM write operations in the LUT RAMs are controlled by clock signal CK from multiplexer 1906 and by write enable signal WEN from multiplexer 1907, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1901A may also be provided to the general interconnect structure for shift register chaining, via output select multiplexer 1911D and CLE output terminal DMUX. Accordingly, the circuits and methods set forth above may be implemented in a device such as the devices of FIGS. 18 and 19, or any other suitable device.

It can therefore be appreciated that new circuits for and methods of controlling the operation of a memory system have been described. It will be appreciated by those skilled in the art that numerous alternatives and equivalents will be seen to exist that incorporate the disclosed invention. As a result, the invention is not to be limited by the foregoing, but only by the following claims.

We claim:

1. A circuit for controlling the operation of a memory system having different types of memory, the circuit comprising:
 a first memory having a first type of memory element and having a first access time;
 a second memory having a second type of memory element and having a second access time, wherein the second type of memory element is different than the first type of memory element;
 a memory control circuit enabling access to the first memory and the second memory;
 a delay buffer comprising a block of random access memory (RAM) on a programmable logic device (PLD) coupled to the second memory to compensate for a difference in the first access time and the second access time by buffering data during a predetermined delay; and
 a circuit for merging output data of the first memory and delayed output data of the second memory to generate ordered output data.

2. The circuit of claim 1 wherein the memory control circuit comprises a first memory controller associated with the first memory and a second memory controller associated with the second memory.

3. The circuit of claim 2 wherein the memory control circuit comprises a memory selection circuit coupled to the first memory controller and the second memory controller, the memory selection circuit enabling access to a desired memory of the first memory and the second memory.

4. The circuit of claim 1 wherein the first memory comprises a solid state drive (SSD) memory.

5. The circuit of claim 1 wherein the second memory comprises a dynamic random access memory (DRAM).

6. The circuit of claim 1 wherein data is read from the block of RAM after the predetermined delay.

7. The circuit of claim 1 wherein the PLD is coupled to receive configuration bits.

8. The circuit of claim 7 wherein the block of RAM is coupled to the second memory using programmable interconnect elements that are programmed using the configuration bits.

9. The circuit of claim 1 wherein the first memory comprises a non-volatile memory and the second memory comprises a volatile memory.

10. A circuit for controlling the operation of a memory system having different types of memory, the circuit comprising:
  a first memory having a first type of memory element and having a first access time;
  a second memory having a second type of memory element and having a second access time, wherein the second type of memory element is different than the first type of memory element;
  a memory control circuit enabling access to the first memory and the second memory;
  a delay buffer coupled to the second memory to compensate for a difference in the first access time and the second access time;
  a circuit for merging output data of the first memory and delayed output data of the second memory to generate ordered output data; and
  a memory translator controlling memory accesses to the first memory and the second memory, wherein the memory translator determines whether to access the first memory or the second memory, and wherein the memory translator comprises a profiler for storing information related to access times associated with the first memory and the second memory.

11. The circuit of claim 10 wherein the memory translator determines whether to access the first memory or the second memory based upon the information stored in the profiler.

12. A method of controlling the operation of a memory system having different types of memory, the method comprising:
  accessing a first memory having a first type of memory element and having a first access time;
  accessing a second memory having a second type of memory element and having a second access time, wherein the second type of memory element is different than the first type of memory element;
  coupling data output by the second memory to a delay buffer comprising a block of random access memory (RAM) on a programmable logic device (PLD) to compensate for a difference in the first access time and the second access time by buffering the data during a predetermined delay; and
  merging output data of the first memory and delayed output data of the second memory to generate ordered output data.

13. The method of claim 12 wherein accessing the first memory comprises accessing the first memory by way of a first memory controller associated with the first memory and accessing the second memory comprises accessing the second memory by way of a second memory controller associated with the second memory.

14. The method of claim 13 further comprising implementing a memory selection circuit coupled to the first memory controller and the second memory controller, the memory selection circuit enabling access to a selected memory of the first memory and the second memory.

15. The method of claim 12 wherein accessing a first memory comprises implementing an SSD memory.

16. The method of claim 12 wherein accessing a second memory comprises implementing a DRAM.

17. The circuit of claim 1 further comprising a metadata delay buffer enabling metadata associated with a data request to be matched up with output data for the data request.

18. The Circuit of claim 10 further comprising a metadata delay buffer enabling metadata associated with a data request to be matched up with output data for the data request.

19. The method of claim 12 further comprising enabling metadata associated with a data request to be matched up with output data for the data request.

* * * * *